(12) United States Patent
Chen et al.

(10) Patent No.: US 9,412,666 B2
(45) Date of Patent: Aug. 9, 2016

(54) EQUAL GATE HEIGHT CONTROL METHOD FOR SEMICONDUCTOR DEVICE WITH DIFFERENT PATTERN DENSITES

(71) Applicant: Taiwan Semiconductor Manufacturing Company, Ltd., Hsin-Chu (TW)

(72) Inventors: Chao-Cheng Chen, Hsin-Chu (TW); Ming-Jie Huang, Hsin-Chu (TW); Yu Chao Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/938,372

(22) Filed: Nov. 11, 2015

(65) Prior Publication Data

US 2016/0126142 A1    May 5, 2016

Related U.S. Application Data

(63) Continuation of application No. 14/527,848, filed on Oct. 30, 2014, now Pat. No. 9,214,358.

(51) Int. Cl.
| | |
|---|---|
| *H01L 21/302* | (2006.01) |
| *H01L 21/461* | (2006.01) |
| *H01L 21/8234* | (2006.01) |
| *H01L 21/3115* | (2006.01) |
| *H01L 21/28* | (2006.01) |
| *H01L 21/321* | (2006.01) |
| *H01L 29/66* | (2006.01) |

(52) U.S. Cl.
CPC .. *H01L 21/823437* (2013.01); *H01L 21/28035* (2013.01); *H01L 21/3115* (2013.01); *H01L 21/3212* (2013.01); *H01L 21/823431* (2013.01); *H01L 21/823481* (2013.01); *H01L 29/66545* (2013.01)

(58) Field of Classification Search
CPC .............. H01L 21/823437; H01L 21/3115; H01L 21/28035
USPC ........................................... 438/740
See application file for complete search history.

(56) References Cited

U.S. PATENT DOCUMENTS

| | | |
|---|---|---|
| 9,287,132 B2 | 3/2016 | Park et al. |
| 2012/0190201 A1 | 7/2012 | Park et al. |
| 2013/0288471 A1 | 10/2013 | Chi |

FOREIGN PATENT DOCUMENTS

| | | |
|---|---|---|
| KR | 1020060127485 A | 12/2006 |
| KR | 101285948 B1 | 7/2013 |

*Primary Examiner* — David S Blum
(74) *Attorney, Agent, or Firm* — Slater Matsil, LLP

(57) ABSTRACT

A method of forming a semiconductor integrated circuit (IC) includes forming a first semiconductor layer over a substrate, the first semiconductor layer having an uneven upper surface, forming a stop layer over the first semiconductor layer, the first semiconductor layer disposed between the substrate and the stop layer, and treating the stop layer to change its etch selectivity relative to the first semiconductor layer.

20 Claims, 13 Drawing Sheets

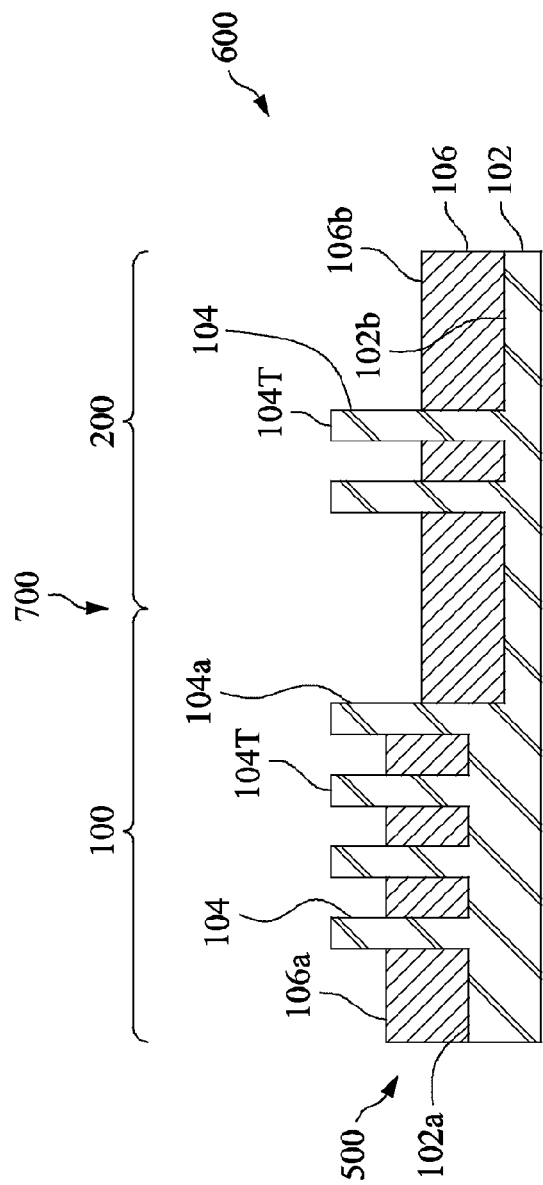
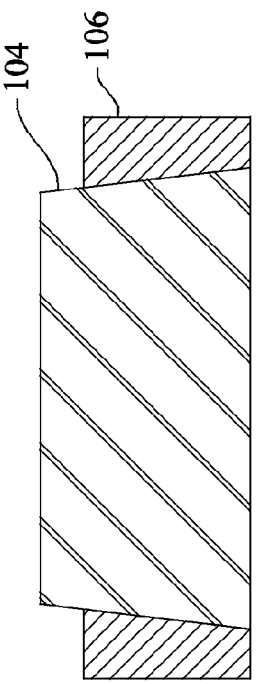

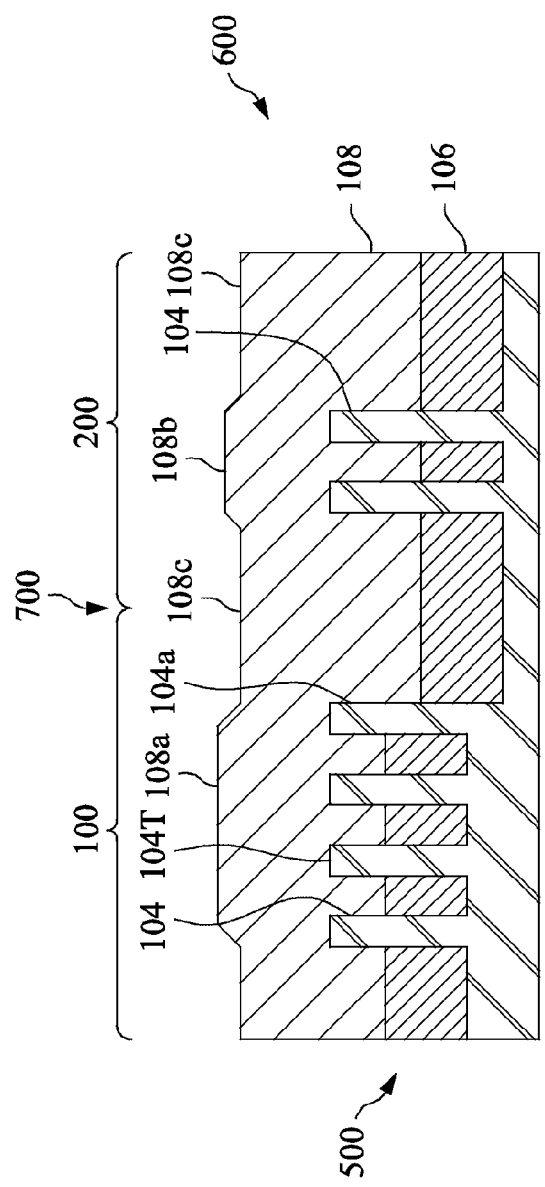
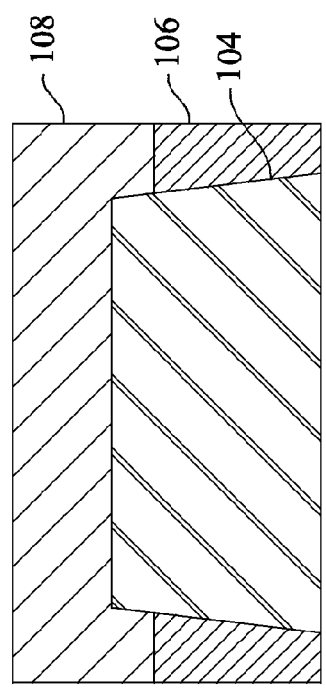
Fig. 3A
Fig. 3B

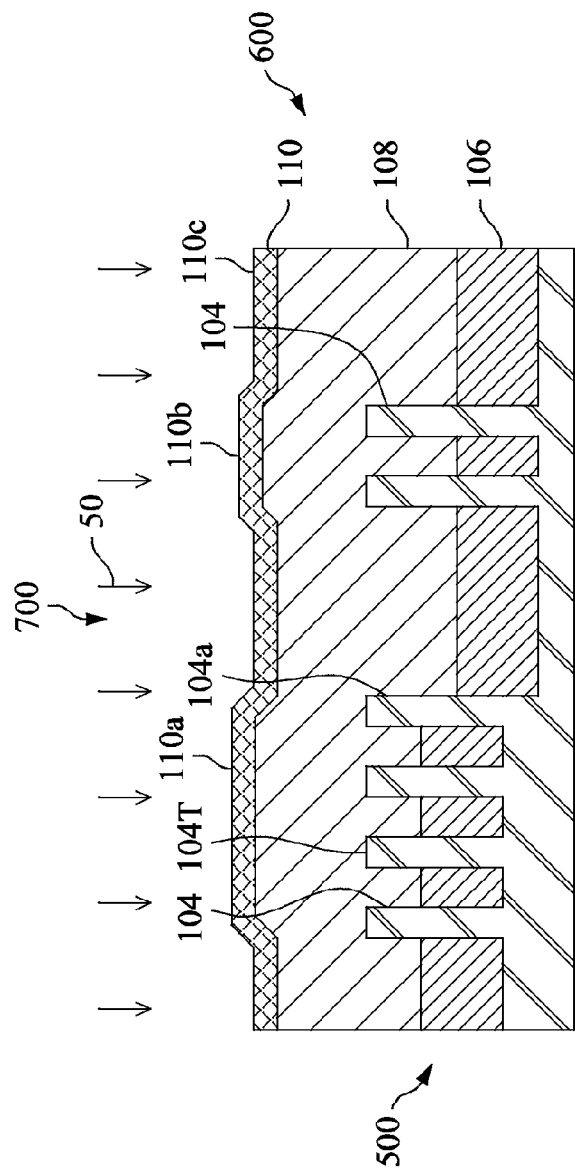
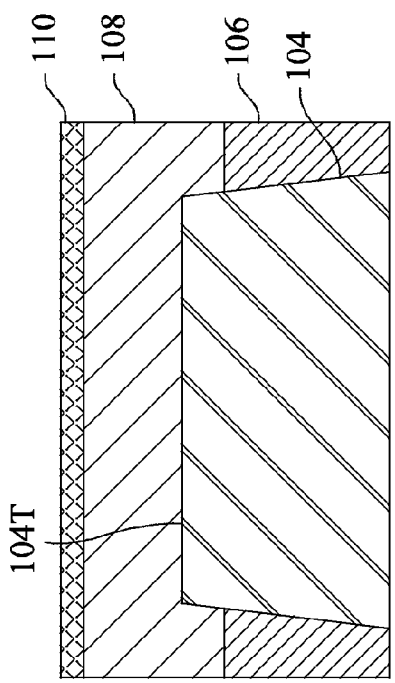
Fig. 4A
Fig. 4B

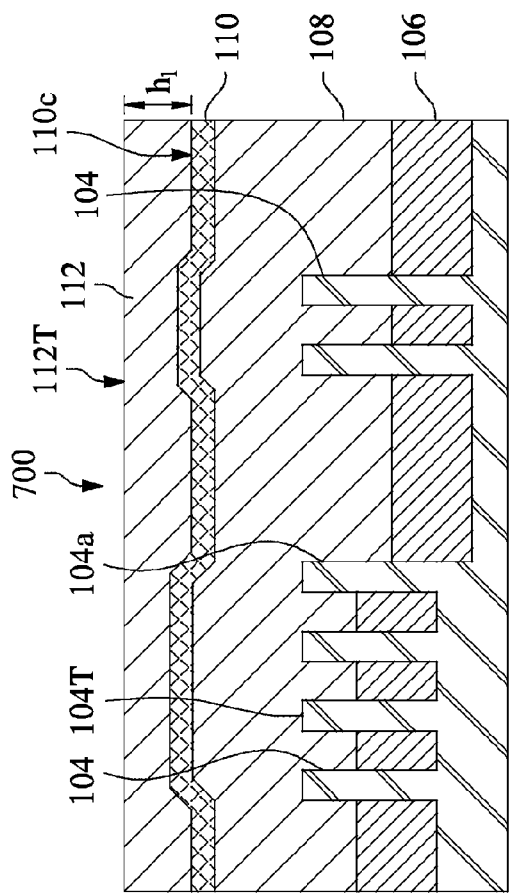
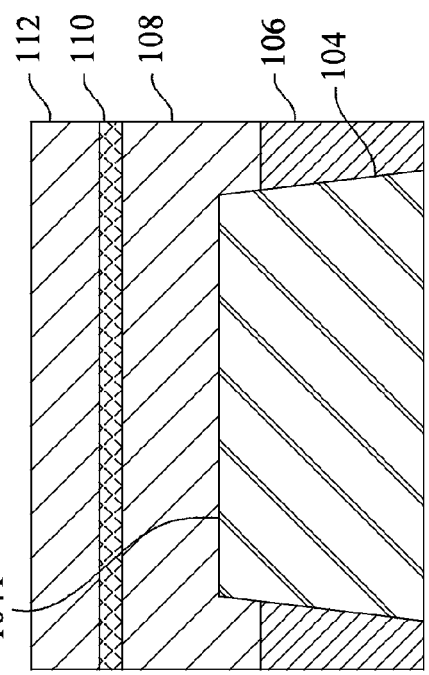
Fig. 6A
Fig. 6B

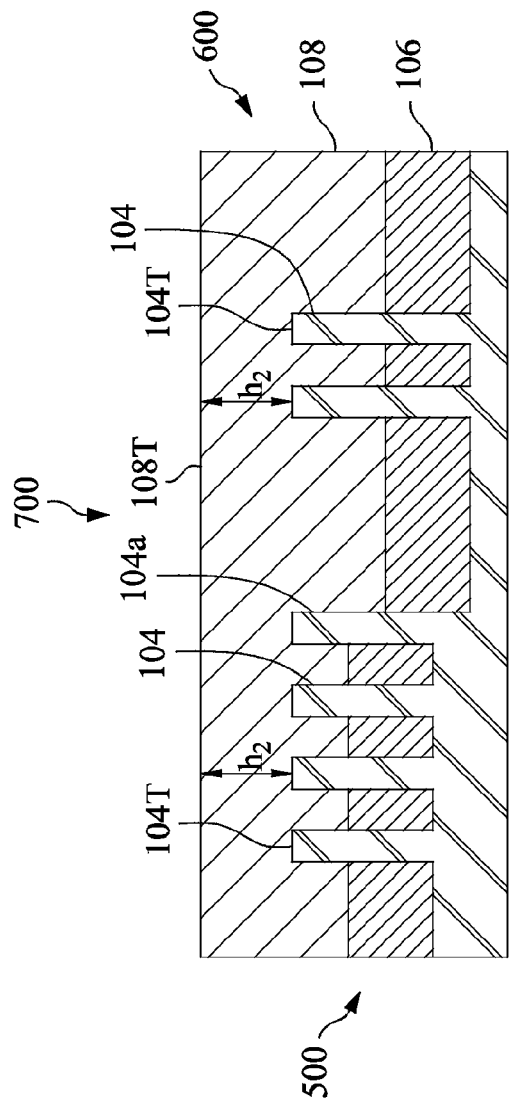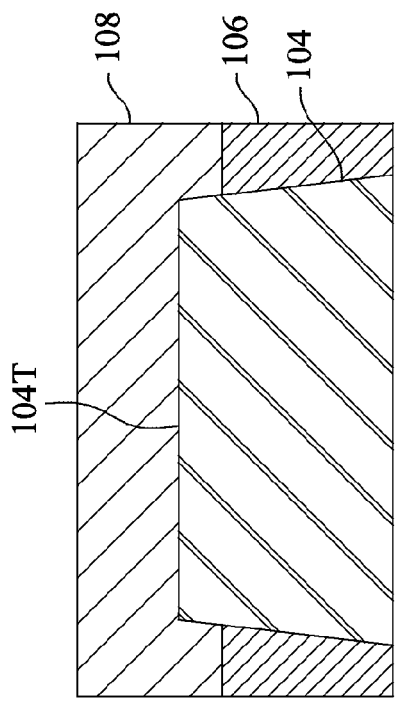
Fig. 7A
Fig. 7B

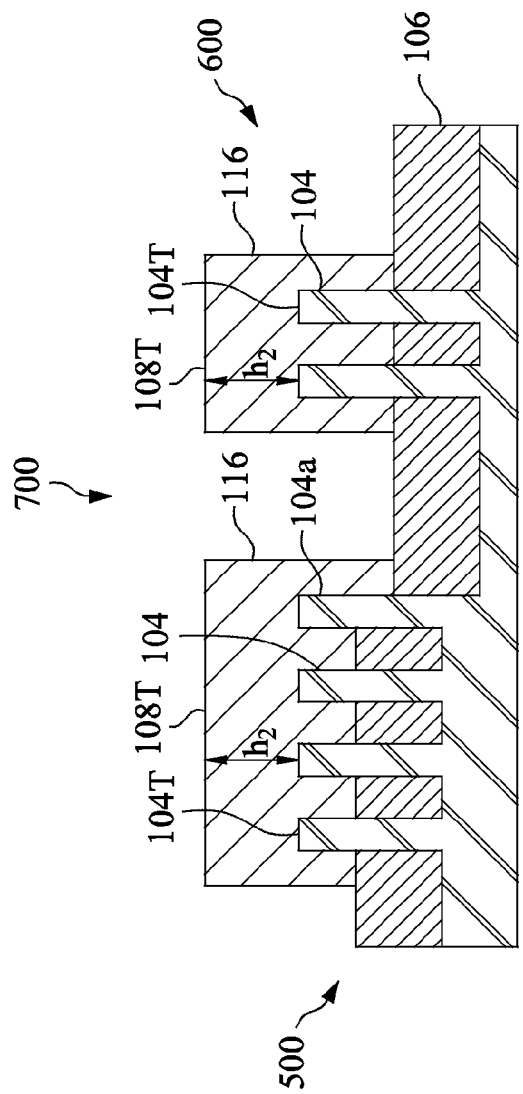
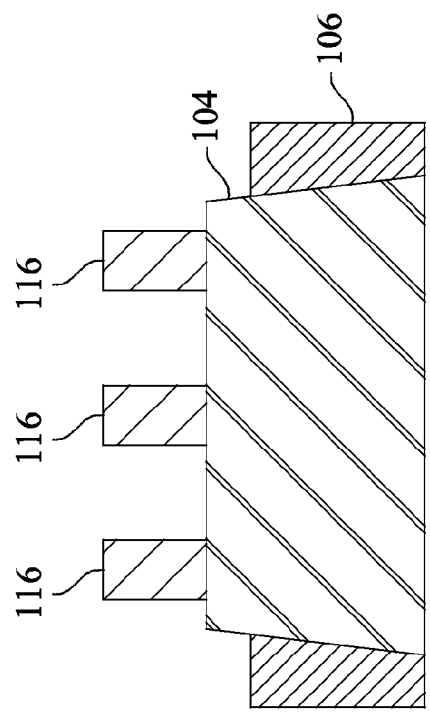
Fig. 8A
Fig. 8B

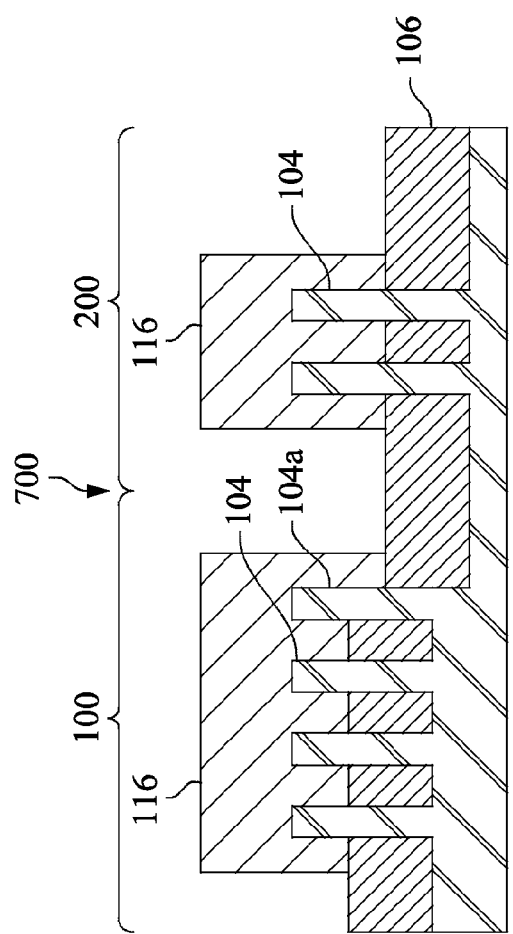
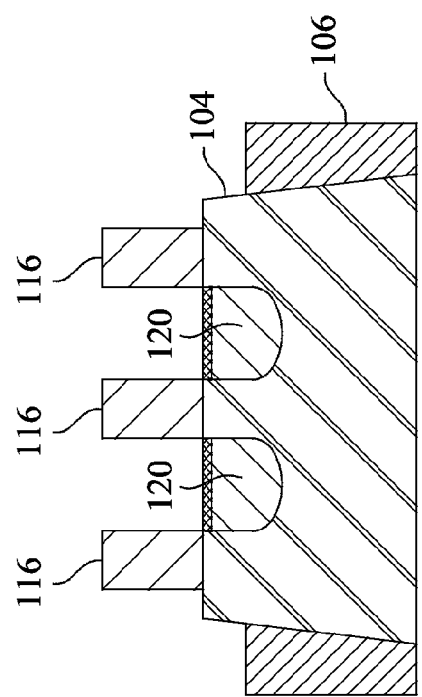
Fig. 9A
Fig. 9B

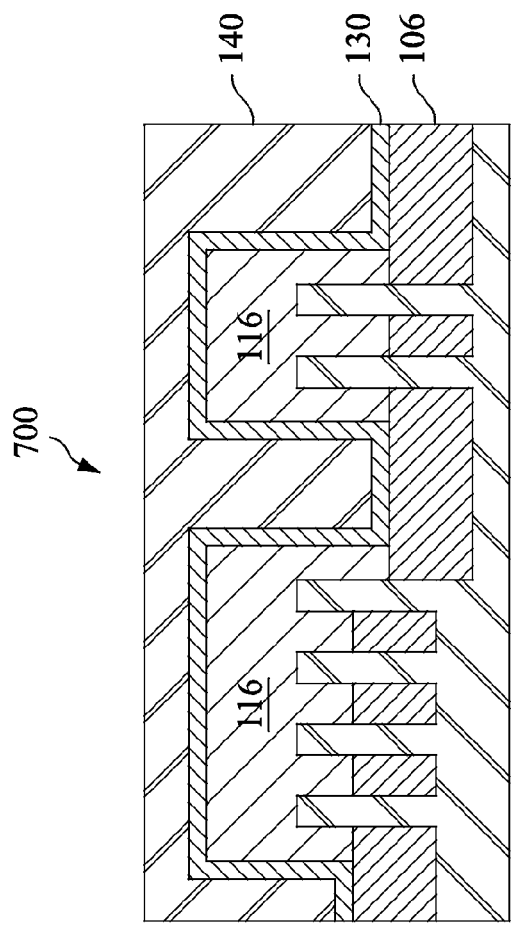
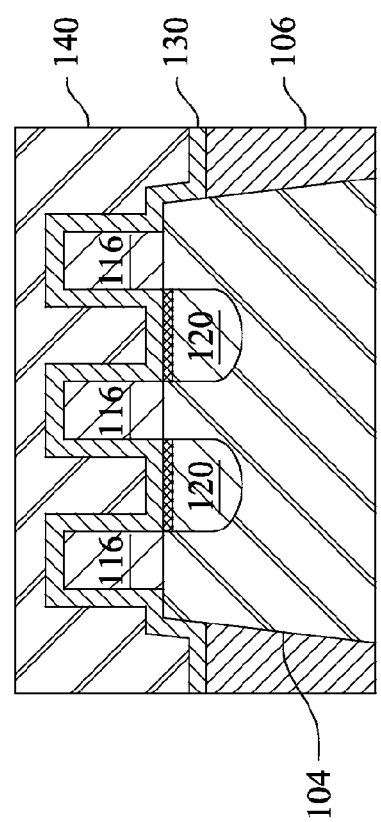
Fig. 10A
Fig. 10B

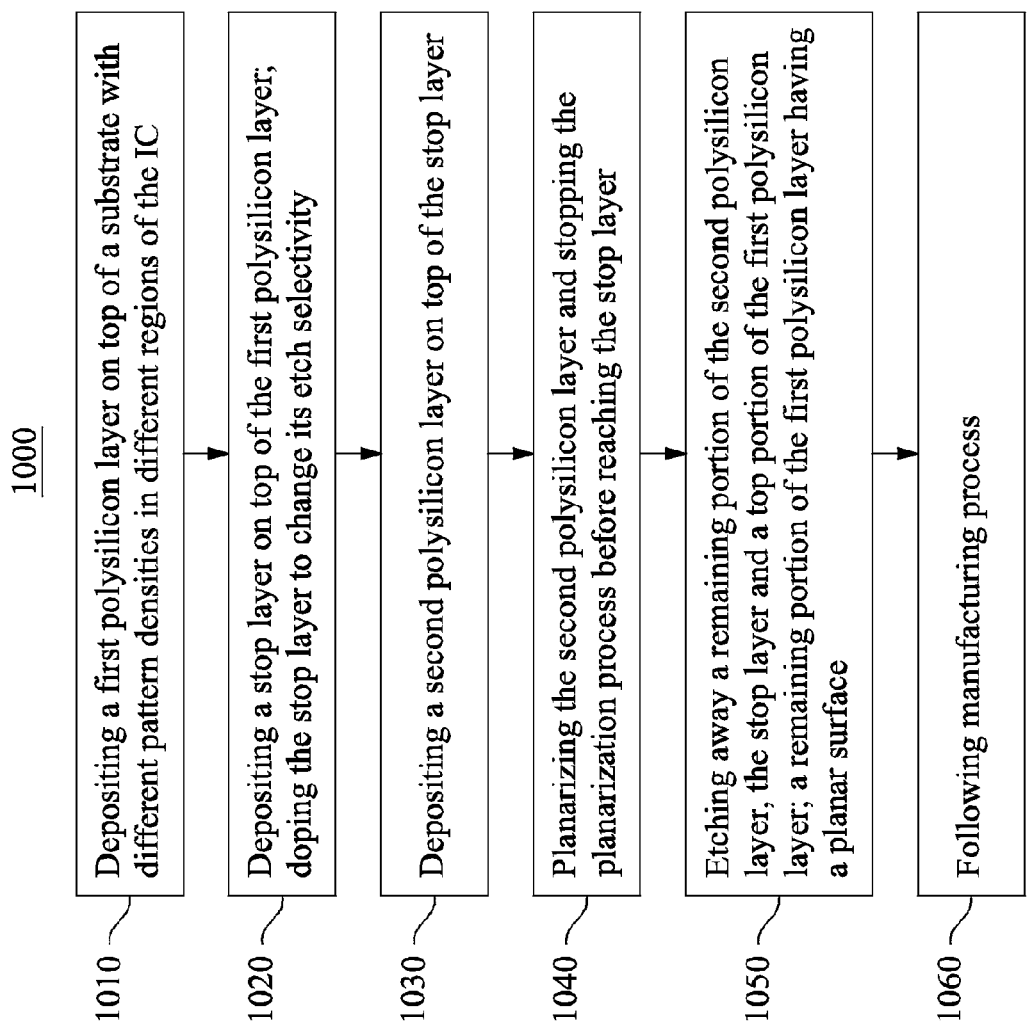

EQUAL GATE HEIGHT CONTROL METHOD FOR SEMICONDUCTOR DEVICE WITH DIFFERENT PATTERN DENSITES

PRIORITY CLAIM AND CROSS-REFERENCE

This application is a continuation of U.S. application Ser. No. 14/527,848, now U.S. Pat. No. 9,214,358, entitled "Equal Gate Height Control Method for Semiconductor Device with Different Pattern Densities," filed Oct. 30, 2014, which application is incorporated herein by reference.

BACKGROUND

The semiconductor integrated circuit (IC) industry has experienced rapid growth. Over the course of this growth, functional density of the devices has generally increased while the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Semiconductor ICs include devices such as transistors, capacitors, resistors, and inductors that are formed in or on the substrate of an IC using lithography and patterning techniques. These semiconductor devices are inter-connected according to the design of the IC to implement different functions. In a typical IC, the silicon area is divided into many regions for different functions. Due to the nature of different designs entailed by the different functions, some functional regions have a higher pattern density than other regions. For example, a region of the IC used for static random access memory (SRAM) may have a higher pattern density than a region for a logic function. The difference in pattern density may cause an undesirable "loading effect". For example, a polysilicon layer formed on the substrate may be thicker in regions with high pattern density than regions with low pattern density. The unevenness, or topography, of the polysilicon layer may adversely affect the IC manufacturing process. There is a need in the art to address the loading effect caused by non-uniform pattern densities.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-12B illustrate various cross-sectional views of a semiconductor device at various stages of fabrication according to embodiments of the present disclosure; and FIG. 13 illustrates a flowchart illustrating a method for of fabricating a semiconductor device according to various aspects of the present disclosure.

DETAILED DESCRIPTION

Figure 1:
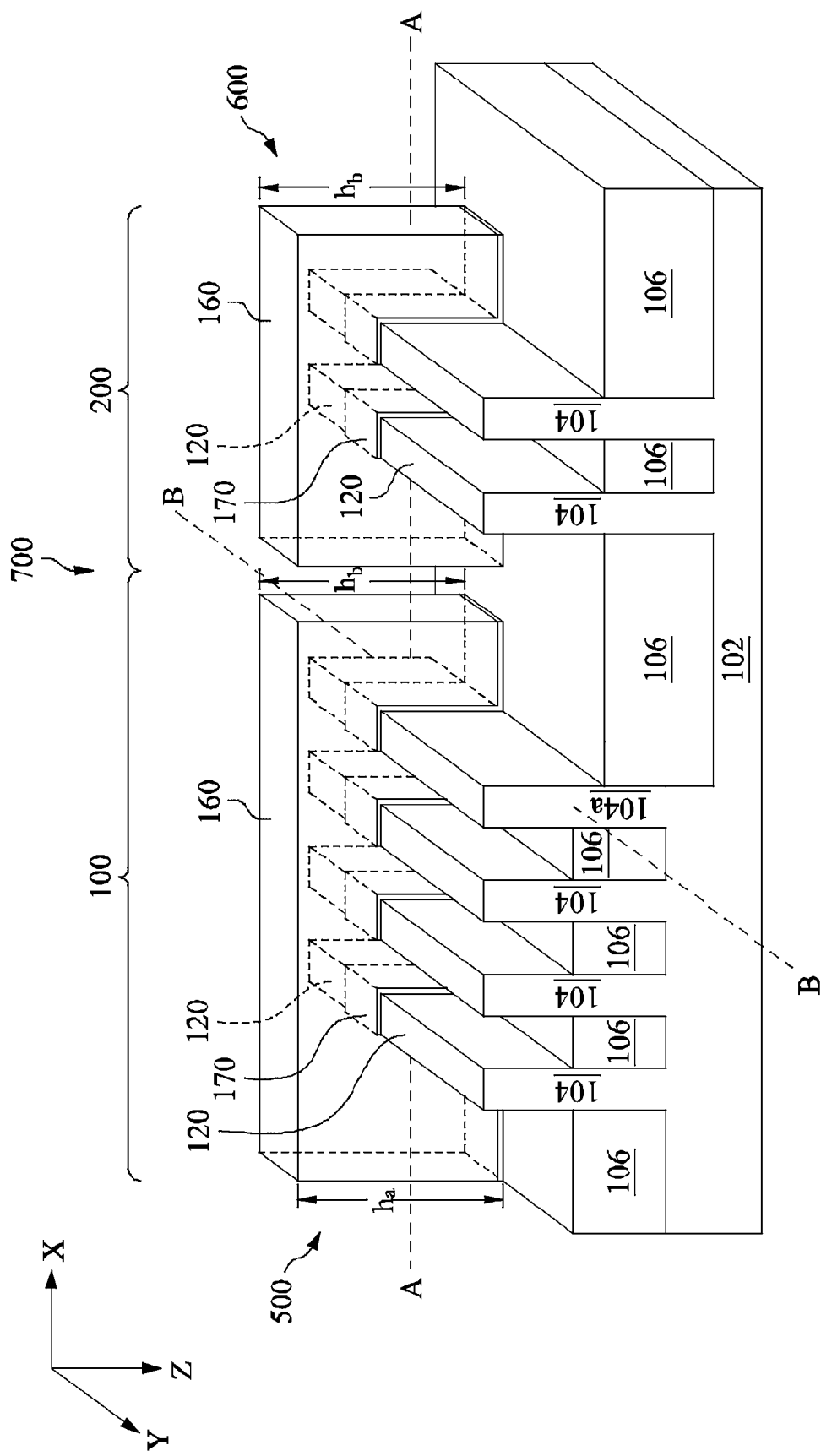
FIG. 1 illustrates a perspective view of an embodiment of a semiconductor device according to one or more aspects of the present disclosure.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

For illustration purpose, the present disclosure is described using a FinFET (fin field-effect transistor) device as an example. However, methods disclosed in the present disclosure are generic and are not limited to FinFET devices. One skilled in the art will appreciate from the descriptions below that methods in the present disclosure are applicable to planar devices as well. The use of FinFET device in the discussion below should not limit the scope of the current disclosure. In addition, processing steps described hereafter are for illustration purpose only and should not unduly limit the scope of the current disclosure. It is to be understood that the described processing steps may be modified, the order of processing steps may be altered, some processing steps may be deleted, and more processing steps may be added. These and other modifications are fully intended to be included in the scope of the current disclosure.

Illustrated in FIG. 1 is a perspective view of a semiconductor device 700, in accordance with some embodiments of the present disclosure. The semiconductor device 700 includes a first region 100 and a second region 200, each having a FinFET transistor 500 and 600, respectively. Each of the FinFET transistors 500 and 600 may be an n-type FinFET or a p-type FinFET. Semiconductor device 700 may be included in an IC such as a microprocessor, memory device, and/or other IC. Device 700 includes a substrate 102, a plurality of fins 104, a plurality of isolation structures 106, and a gate structure 160 disposed on each of fins 104 of transistor 500 and 600 separately. Each of fins 104 includes a source/drain region denoted 120 where a source or drain feature is formed in, on, and/or surrounding fin 104. A channel region of fin 104 underlies gate structure 160 and is denoted as 170.

In accordance with some embodiments, the first region 100 has a higher pattern density than the second region 200. The first region 100 might correspond to a SRAM region in the IC, and the second region 200 might corresponds to a logic region, a peripheral region, a standard-cell region, or other region with lower pattern density in the IC. In addition, the fins 104 in region 100 may have a height different from that of fins 104 in region 200, possibly due to different amount of etching when forming the fins 104 in different regions. Despite the different fin heights, the top surfaces 104T of all fins 104 (see FIG. 2A), in both first region 100 and second region 200, are coplanar, in accordance with an embodiment of the present disclosure. The different heights for fins 104 mean that an upper surface 102a (see FIG. 2A) of substrate 102 in region 100 is not coplanar with an upper surface 102b (see FIG. 2A) of substrate 102 in region 200. In the example shown in FIG. 1, the boundary between the two different upper surfaces of substrate 102 falls on the right edge of the rightmost fin (donated as fin 104a) of FinFET transistor 500. As a result of the different top surfaces of substrate 102, an upper surface 106a (see FIG. 2A) of isolation structure 106 in region 100 may not be coplanar with an upper surface 106b (see FIG. 2A) of isolation structure 106 in region 200, in accordance with some embodiments. As illustrated in FIG. 1, since gate structures 160 extend from an upper surface of isolation structures 106 upwards, the uneven upper surface of isolation structures 106 results in a first height $h_a$ and a second height $h_b$ for a left sidewall and a right sidewall of gate structure 160 of transistor 500, respectively. The gate structure 160 of transistor 600 has a height $h_b$ for both the left and the right sidewalls. Despite the different gate structure sidewall heights, the top surfaces of gate structures 160 of transistors 500 and 600 are coplanar, in accordance with an embodiment of the present disclosure. As a result, gate height, defined as the distance from the top surface of fins 104 to the top surface of gate structures 160 (refer to $h_2$ in FIG. 7A), are equal in all regions of the IC chips, regardless of pattern densities, in accordance with an embodiment of the present disclosure.

In an embodiment, semiconductor device 700 is provided during fabrication and gate structure 160 is a sacrificial gate structure such as formed in a replacement gate process used to form a metal gate structure. In an embodiment, gate structure 160 includes polysilicon. In another embodiment, gate structure 160 includes a metal gate structure.

Semiconductor device 700 may include other layers and/or features not specifically illustrated including additional source/drain regions, interlayer dielectric (ILD) layers, contacts, interconnects, and/or other suitable features.

As shown in FIG. 1, three directions X, Y and Z are defined. A direction X is parallel to the longitudinal direction of gate structures 160. A direction Y is perpendicular to direction X, along a longitudinal direction of fins 104. A direction Z is perpendicular to both X and Y directions, along the vertical direction of gate structures 160.

Referring to FIGS. 2-12, illustrated are various views of a FinFET semiconductor device 700 at various stages of fabrication according to embodiments of the present disclosure. In FIGS. 2-12, a figure with letter "a" in its number illustrates a cross-sectional view of semiconductor device 700 in FIG. 1 at various stages of fabrication along a line A-A, where line A-A is inside gate structures 160 and parallel to direction X; and a figure with letter "b" in its number illustrates a cross-sectional view of semiconductor device 700 in FIG. 1 at various stages of fabrication along a line B-B, where line B-B is inside fin 104a of transistor 500 and parallel to direction Y.

FIGS. 2A and 2B illustrate two cross-sectional views of a FinFET semiconductor device 700 shown in FIG. 1 having a substrate 102 at one of various stages of fabrication according to embodiments of the present disclosure. As shown in FIGS. 2A and 2B, in an embodiment of the present disclosure, fins 104 are formed by etching into the substrate 102 of semiconductor device 700. Semiconductor device 700 comprises two regions, a first region 100 and a second region 200. As illustrated in FIG. 2A, the first region 100 has four fins 104 and the second region 200 has two fins 104. The first region 100 may represent a region with higher pattern density than the second region 200, in some embodiments. Isolation structures 106 are formed between fins 104. Fins 104 rise above the isolation structures 106.

It should be noted that the number of fins 104 is not limited by the semiconductor structure shown in FIGS. 2A and 2B and can include more or less than that depicted in FIGS. 2A and 2B. In embodiments of the present disclosure, fins 104 may be simultaneously formed, such that each fin 104 may comprise the same materials or layers.

Substrate 102 may be a silicon substrate. Alternatively, substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, substrate 102 is a semiconductor on insulator (SOI) substrate.

In some embodiments, the fins 104 may be formed in the substrate 102 by etching trenches in the substrate 102. The etching may be any suitable etch process, such as a reactive ion etch (RIE), neutral beam etch (NBE), the like, or a combination thereof. The etching may be anisotropic. The amount of etching may be different for fins 104 of transistor 500 and fins 104 of transistor 600, such that the fins 104 in region 100 and region 200 have different heights, i.e., an upper surface 102a of substrate 102 is not coplanar with an upper surface 102b of substrate 102.

As shown in FIG. 2A, an insulation material is formed between neighboring fins 104 to form the isolation structure 106. In accordance with some embodiments, the isolation structure 106 forms a shallow trench isolation (STI) layer 106. The insulation material may be an oxide, such as silicon oxide, silicon nitride, silicon oxynitride, other suitable materials, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, STI layer 106 may have a multi-layer structure such as a thermal oxide liner layer filled with silicon nitride or silicon oxide. Due to the uneven surface 102a and 102b of the substrate 102, STI layer 106 might have uneven upper surfaces 106a and 106b, in some embodiments.

FIGS. 3A and 3B illustrate two cross-sectional views of a FinFET semiconductor device 700 shown in FIGS. 2A and 2B, after a first polysilicon layer 108 is formed on top of the isolation structures 106. In an embodiment of the present disclosure, the first polysilicon layer 108 comprises polycrystalline-silicon (poly-Si, polysilicon). The first polysilicon layer 108 may be deposited by CVD, sputter deposition, furnace growth process, or other suitable techniques known and used in the art. In accordance with some embodiments, the first polysilicon layer 108 has a thickness between about 1200 Angstrom (Å) and about 1800 Å, such as 1570 Å.

The pattern density difference in region 100 and region 200 causes a loading effect. As illustrated in FIG. 3A in accordance with some embodiments, an upper surface 108a above fins 104 of transistor 500 is higher than an upper surface 108b above fins 104 of transistor 600, and both upper surfaces 108a and 108b are higher than upper surfaces 108c of the first polysilicon layer 108, where surfaces 108c are above areas without fins.

FIGS. 4A and 4B illustrate two cross-sectional views of a FinFET semiconductor device 700 shown in FIGS. 3A and 3B, after a stop layer 110 is formed on top of polysilicon layer 108. In some embodiments, the stop layer may comprise material selected from a group comprising silicon nitride, silicon carbide, and silicon oxynitride. The stop layer 110 may be deposited using suitable methods known in the art, such as CVD, PVD, printing, spin coating, spray coating, sintering, or thermal oxidation. In accordance with some embodiments, the stop layer has a thickness between about 50 Å to about 100 Å. In an embodiment of the present disclosure, the stop layer is a silicon nitride layer with a thickness of about 100 Å. In some embodiments, the stop layer may conform to the upper surface of polysilicon layer 108, thus exhibiting the same topography of the underlying polysilicon layer 108. As illustrated by the example shown in FIG. 4A, an upper surface 110a of stop layer 110 above fins 104 of transistor 500 is higher than an upper surface 110b of stop layer 110 above fins 104 of transistor 600, and both upper surface 110a and 110b are higher than an upper surface 110c of the stop layer above areas without fins. In other embodiments, the stop layer 110 might have a planar upper surface.

As illustrated in FIG. 4A, the stop layer 110 is treated by a doping process 50. The doping process 50 changes the etching properties of the stop layer, so that in a subsequent poly etch back (POEB) process, the ratio of etch rates (i.e., etch selectivity) between the doped stop layer 110 and the polysilicon layer 108 is in a range from about 0.8 to about 1.2, in some embodiments. In an embodiment of the present disclosure, the etch selectivity between the doped stop layer 110 and the polysilicon layer 108 is substantially 1. The dopant may comprise material selected from a group comprising carbon, carbon dioxide, sulfur, and sulfur dioxide, in some embodiments. In an embodiment of the present disclosure, the stop layer 110 is a silicon nitride layer, and the dopant is carbon. The doping process may be achieved via ion implantation, with an implantation energy between about 1 KeV to about 10 KeV, a dose between about $5^{14}$ cm$^{-2}$ to about $6^{15}$ cm$^{-2}$, and an implantation angle between about 88.5° to about 89.5°, in some embodiments. Ion implantation devices, such as devices manufactured by Varian Company, Palo Alto, Calif., and Applied Materials, Inc. may be used.

Figure 5A:
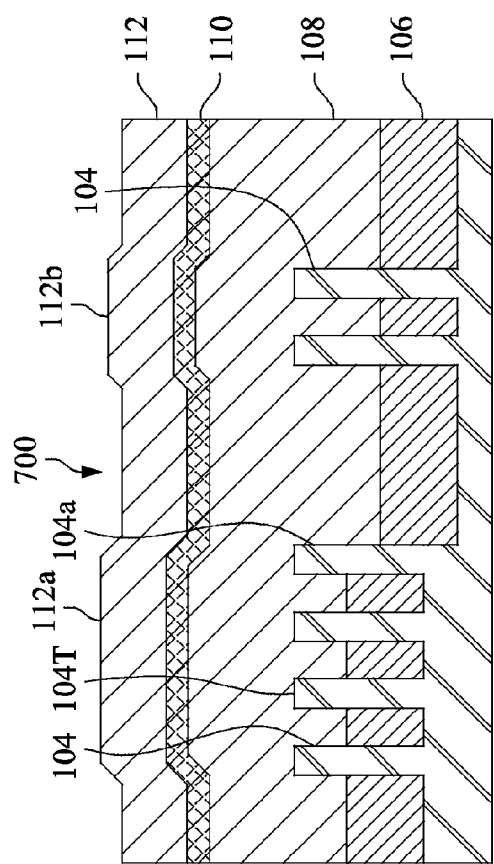
Figure 5B:
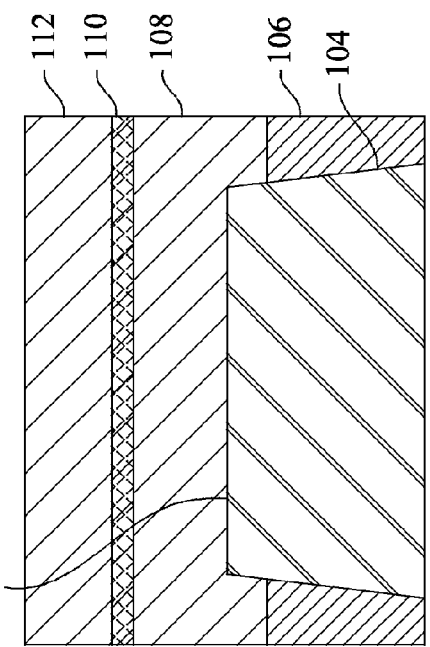

FIGS. 5A and 5B illustrate two cross-sectional views of a FinFET semiconductor device 700 shown in FIGS. 4A and 4B, after a second polysilicon layer 112 is formed on top of the stop layer 110. In an embodiment of the present disclosure, the second polysilicon layer 112 comprises polysilicon. The second polysilicon layer 112 may be deposited by CVD, sputter deposition, furnace growth process, or other suitable techniques known and used in the art. In an embodiment of the present disclosure, the second polysilicon layer 112 comprises the same material as the first polysilicon layer 108. In accordance with some embodiments, the second polysilicon layer 112 has a thickness between about 500 Å and about 2000 Å. In an embodiment of the present disclosure, the second polysilicon layer 112 is a polysilicon layer with a thickness of about 1560 Å.

As illustrated in FIG. 5A, after the second polysilicon layer 112 is formed, the stop layer 110 is sandwiched between the first polysilicon layer 108 and the second polysilicon layer 112. The topography of the underlying layers (i.e., layers 108 and 110) may be reflected in the upper surface of the second polysilicon layer 112, as shown by the uneven upper surfaces 112a and 112b in FIG. 5A. In other embodiments, the second polysilicon layer 112 may have a planar upper surface.

Referring to FIGS. 6A and 6B. A planarization process, such as a chemical mechanical planarization (CMP) process, may be applied to semiconductor device 700 shown in FIGS. 5A and 5B, to obtain a planar upper surface 112T for the second polysilicon layer 112. The planarization process stops before reaching stop layer 110. In some embodiments, the thickness $h_1$ of the remaining second polysilicon layer 112, defined as the distance between an upper surface 112T of the second polysilicon layer 112 and an upper surface 110c of the stop layer 110, is between about 200 Å to about 400 Å. In an embodiment of the present disclosure, the thickness $h_1$ of the remaining second polysilicon layer 112 is about 400 Å.

In a conventional process, the CMP process is controlled to stop when it reaches the stop layer 110. To stop the CMP process before it reaches the stop layer 110, a simple experimental approach is described below as an example. Firstly, one can measure a first elapsed time $T_1$ it takes for the CMP process to reach the stop layer 110. Secondly, one can estimate a second elapsed time $T_2$ based on an etching rate R of the CMP process and a desired thickness $h_1$ of the remaining second polysilicon layer 112, i.e., $T_2 = h_1/R$. Finally, a new CMP process on a new device 700 is performed for a time period of $T_3 = T_1 - T_2$, and the thickness $h_1$ of the remaining second polysilicon layer 112 is measured to confirm that it is within the desired range. The new CMP process time $T_3$ may need to be adjusted a few times until the thickness $h_1$ of the remaining second polysilicon layer 112 falls within the desired range.

Referring to FIGS. 7A and 7B. An etching process, called polysilicon etch back (POEB) process, is performed on the semiconductor device 700 shown in FIGS. 6A and 6B to remove a remaining portion of the second polysilicon layer 112, stop layer 110 and a top portion of the first polysilicon layer 108. In some embodiments, the etch selectivity between the doped stop layer 110 to the first and second polysilicon layer (i.e., both the first polysilicon layer 108 and the second polysilicon layer 112 comprise polysilicon) is in a range from about 0.8 to about 1.2. In an embodiment of present disclosure, the etching selectivity between doped stop layer 110 to the first and the second polysilicon layer is substantially 1. As a result, a planar surface 108T is obtained across all regions of the semiconductor device 700, regardless of the pattern densities. In accordance with some embodiments, the etching process may be a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like. In an embodiment, the etching process is performed via a plasma etch at a pressure in a range from about 2 mTorr to about 5 mTorr, at a power in a range from about 700 watts to about 1200 watts, with an etching bias in a range from about 50 volts to about 100 volts, at a temperature in a range from about 40° C. to about 70° C., with a plasma flow including from about 10 standard cubic centimeters per minute (sccm) to about 30 sccm of $SF_6$, about 30 sccm to about 100 sccm of $CH_2F_2$, about 50 sccm to about 200 sccm of $N_2$, and about 100 sccm to about 200 sccm of $H_e$. Dry etch tools, such as, tool manufactured by Lam Research Corporation, Tokyo Electron Limited (TEL), Applied Materials, Inc., Hitachi Ltd., or a combination thereof, may be used. Alternatively, etch tools supplied by other companies may be used.

A remaining portion of the first polysilicon layer 108 has a planar surface 108T and a thickness $h_2$ from about 960 Å to about 1100 Å, where the thickness $h_2$ is defined as the distance from the top surface 108T of the first polysilicon layer 108 to a top surface 104T of the fins 104. The thickness $h_2$ of the remaining portion of the first polysilicon layer 108 is equivalent to gate height $h_2$, when the remaining portion of the first polysilicon layer 108 is patterned to form polysilicon gate structures, as described below. In an embodiment of the present disclosure, the remaining portion of polysilicon layer 108 has a thickness $h_2$ of about 960 Å.

Referring to FIGS. 8A and 8B, polysilicon gate structures 116, hereafter also polysilicon stacks 116, are formed by patterning the remaining portion of the first polysilicon layer 108 shown in FIGS. 7A and 7B, using lithography and etching process known in the art. The polysilicon stacks 116 are formed such that the direction of the length of each polysilicon stack 116 is in parallel with the direction of the width of each fin 104, as shown in FIG. 8A and the direction of the width of each polysilicon stack 116 is in parallel with the direction of the length of each fin 104, as shown in FIG. 8B, in embodiments of the present disclosure.

It should be noted that the number of polysilicon stacks 116 is not limited by the semiconductor structure shown in FIGS. 8A and 8B and can include more or less than that depicted in FIGS. 8A and 8B. In embodiments of the present disclosure, polysilicon stacks 116 may be simultaneously formed, such that each polysilicon stack 116 may comprise the same materials or layers. Since the top surface 104T of all fins 104 are coplanar, and the remaining portion of the first polysilicon layer 108 has a planar surface 108T, gate height $h_2$ are the same for transistors 500 and 600 in different regions of the IC, regardless of pattern densities.

FIGS. 9A and 9B illustrate two cross-sectional views of semiconductor device 700 shown in FIGS. 8A and 8B, after source/drain regions 120 are formed on opposite sides of at least one respective polysilicon stack 116 in the first region 100 and the second region 200 of the IC, according to embodiments of the present disclosure. In embodiments of the present disclosure, source/drain regions 120 may be epitaxy regions formed within fins 104. In embodiments of the present disclosure, source/drain regions 120 may be silicon epitaxy regions. In embodiments of the present disclosure, source/drain regions 120 may be silicon germanium epitaxy regions. However, numerous other embodiments of epitaxially grown materials are possible such as, silicon, silicon germanium, silicon carbide, germanium, gallium arsenide, indium phosphide, and/or other suitable materials.

In embodiments of the present disclosure, a spacer layer (not shown) may be deposited over sidewalls of polysilicon stacks 116 to define source/drain regions 120 on fins 104. After spacer layer is deposited, an epitaxy (epi) process is performed to form source/drain regions 120 within fins 104. In embodiments of the present disclosure, the source/drain regions can be implemented by performing an etching process to form recess regions in fins 104 and then performing an epitaxy (epi) process to deposit a semiconductor material in the recess regions. The etching process may be a plasma dry etching processing. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the substrate. The semiconductor material may include Si, SiP, SiC, SiCP, a combination thereof, or any other suitable semiconductor material.

Following the processing illustrated in FIGS. 9A and 9B, an etch stop layer (ESL) 130 and an inter-layer dielectric layer (ILD) 140 are formed over the gate spacers (not shown), the polysilicon stacks 116, source/drain regions 120, fins 104 and isolation structures 106, as illustrated in FIGS. 10A and 10B. The ESL 130 may be conformally deposited over semiconductor device 700. In an embodiment, ESL 130 may comprise SiN, SiCN, SiON, the like, or a combination thereof and may be formed by atomic layer deposition (ALD), molecular layer deposition (MLD), a furnace process, CVD, plasma enhanced CVD (PECVD), the like, or a combination thereof.

After ESL 130 is formed, ILD 140 may be deposited over ESL 130 and fills the space between polysilicon stacks 116. In some embodiments, ILD layer 140 comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, and/or combinations thereof. The ILD 140 may be formed by CVD, ALD, PECVD, subatmospheric CVD (SACVD), flowable CVD, a high density plasma (HDP), a spin-on-dielectric process, the like, or a combination thereof.

Figure 11A:
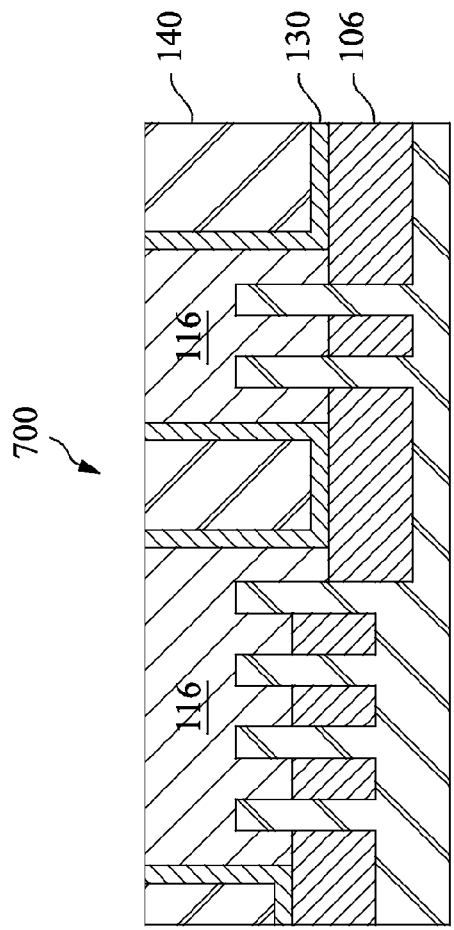
Figure 11B:
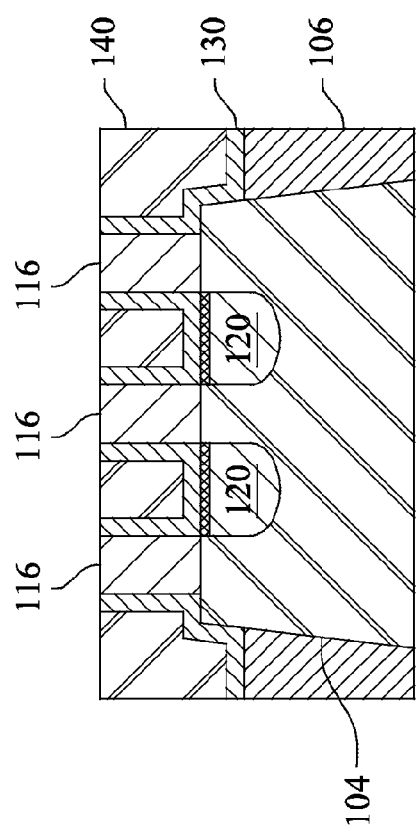

FIGS. 11A and 11B illustrate two cross-sectional views of semiconductor device 700 shown in FIGS. 10A and 10B, after a planarization process is performed to remove portions of ILD 140 and ESL 130 to expose a top surface of each polysilicon stack 116. The planarization process may be performed by a CMP process. Alternatively, any other suitable planarization techniques known in the art may be used.

Figure 12A:
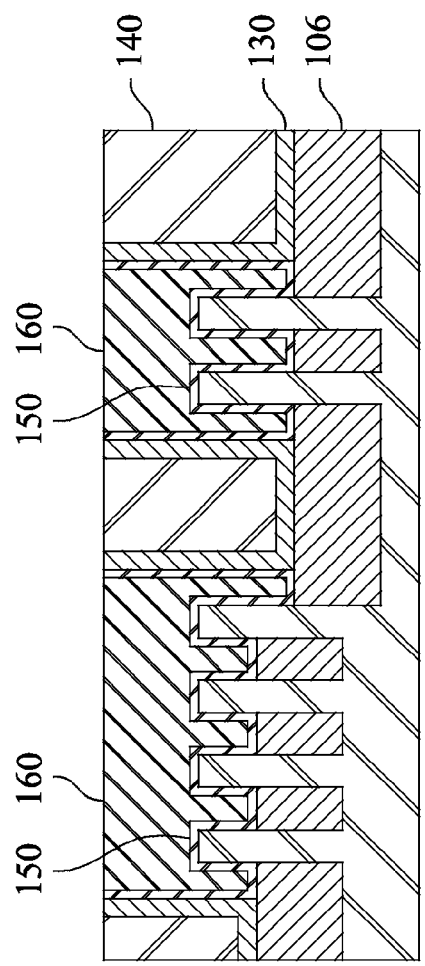
Figure 12B:
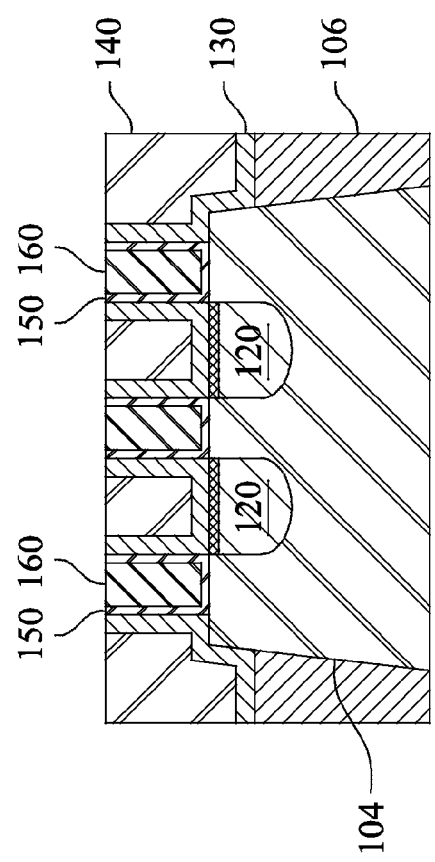

FIGS. 12A and 12B illustrate two cross-sectional views of semiconductor device 700 shown in FIGS. 11A and 11B, after a gate-last process is performed. During the gate-last process disclosed as embodiments of the present disclosure, polysilicon stacks 116 shown in FIGS. 11A and 11B may be replacement polysilicon gates (RPG) and may be replaced by metal gate stacks 160 in FIGS. 12A and 12B. In the gate-last process, polysilicon stacks 116 are removed to form trenches for forming gate stacks. Gate dielectric layer 150 is deposited on sidewalls of the trenches, and gate electrode layer 160 is deposited over the gate electric materials 150 to fill the trenches. The ILD layer 140, gate dielectric layer 150 and gate electrode layer 160 are then polished, in some embodiments.

In some embodiments, gate dielectric material may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In embodiments of the present disclosure, the gate dielectric material may be formed using a suitable process such as atomic layer deposition (ALD), chemical vapor deposition (CVD), physical vapor deposition (PVD), thermal oxidation, UV-Ozone Oxidation, or combinations thereof. The gate dielectric material may further comprise an interfacial layer (not shown) to reduce damage between the gate dielectric material and upper portion of fins 104 (i.e., channel region of the FinFET). The interfacial layer may comprise silicon oxide.

In embodiments of the present disclosure, the gate electrode layer may comprise a single-layer or multilayer structure. In embodiments, the gate electrode layer comprises poly-silicon. Further, the gate electrode layer may be doped poly-silicon with the uniform or non-uniform doping. In other embodiments, the gate electrode layer comprises a metal selected from a group of W, Cu, Ti, Ag, Al, TiAl, TiAlN, TaC, TaCN, TaSiN, Mn, and Zr. In other embodiments, the gate electrode layer comprises a metal selected from a group of TiN, WN, TaN, and Ru. The gate electrode layer may be formed by a suitable process such as ALD, CVD, PVD, plating, or combinations thereof.

FIG. 2-12 are examples used to illustrate various embodiments of the present disclosure. Further IC manufacturing processes are needed to form various features of an IC chip known in the art. Exemplary processes that may be performed include the formation of contact features coupled to the gate structure, and a multi-layer interconnect (MLI) having via and interconnect lines that may interconnect one or more semiconductor devices formed on the substrate.

It should be noted that in embodiments of the present disclosure, a gate-first process may be performed such that gate stacks 160 are deposited before ILD layer 140 is deposited. Although the present disclosure uses a FinFET device as an example, one skilled in the art will appreciate that the method illustrated in FIG. 3-7 for obtaining equal gate heights $h_2$ across different regions of IC chips, regardless of pattern densities, is applicable to planar devices as well. In addition, FIG. 2-12 uses a gate-last process as an example. One skilled in the art will appreciate that the method disclosed in the present disclosure is applicable for a gate-first process as well.

The present disclosure has many advantages. By providing a planar upper surface for the first polysilicon layer 108 after the poly etch back process, equal gate heights can be achieved across all regions of the IC chip regardless of pattern densities. Equal gate heights are beneficial for IC chip performance, by making it easier to provide uniform RC delay and uniform accessing speed across all gates. During IC manufacturing process, multiple layers will be formed on top of the first polysilicon layer, which multiple layers frequently need to have uniform thickness and planar surface. A first polysilicon layer 108 with a planar upper surface provides a perfectly flat base for forming other layers on top of it, which enables further processing such CMP to achieve the desired uniform thickness and planar surface. Lithography and etching techniques are frequently used in IC chip manufacturing. Planar surfaces for layers above the first polysilicon layer, enabled by the current disclosure, are crucial for achieving desired accuracy in lithography. In a gate-last process, the sacrificial polysilicon stacks are removed and replaced by metal gate stacks. Equal polysilicon gate heights help to ensure the success of the gate replacement procedure. In particular, when a planarization process is used to remove ESL and expose a top surface of the sacrificial polysilicon stacks, un-equal polysilicon gate heights may cause the planarization process to stop after removing ESL of a higher polysilicon stack and leaving residues of ESL on top of a lower polysilicon stack. The residual ESL may cause failure of the gate replacement procedure for the lower polysilicon stack. In contrast, an equal gate height will ensure that ESL on top of all the sacrificial polysilicon stacks are sufficiently removed, so the subsequent polysilicon stacks removal and replacement procedure can finish properly.

FIG. 13 illustrates a flow chart of a method for forming a semiconductor device with equal polysilicon gate heights in different regions of the IC chips, regardless of pattern densities, in accordance with various embodiments of the present disclosure. The flowchart shown in FIG. 13 is merely an example, which should not unduly limit the scope of the claims. One of ordinary skill in the art would recognize many variations, alternatives, and modifications. For example, various steps as illustrated in FIG. 13 may be added, removed, replaced, rearranged and repeated.

Referring to FIG. 13, at step 1010, a first polysilicon layer is deposited on top of a substrate with different pattern densities in different regions of the IC. At step 1020, a stop layer is deposited on top of the first polysilicon layer. The stop layer is doped to change its etch selectivity. At step 1030, a second polysilicon layer is deposited on top of the stop layer. At step 1040, the second polysilicon layer is planarized. The planarization process stops before reaching the stop layer. At step 1050, an etching processing is performed to etch away a remaining portion of the second polysilicon layer, the stop layer and a top portion of the first polysilicon layer. A remaining portion of the first polysilicon layer has a planar surface. At step 1060, following manufacturing process are performed to fabricate the IC chip. Exemplary processes that may be performed include the formation of gate structures, source/drain regions, contact features coupled to the gate structure, and a multi-layer interconnect (MLI) having via and interconnect lines that may interconnect one or more semiconductor devices formed on the substrate.

In accordance with an embodiment, a method of forming a semiconductor integrated circuit (IC) includes forming a first semiconductor layer over a substrate, the first semiconductor layer having an uneven upper surface, forming a stop layer over the first semiconductor layer, the first semiconductor layer disposed between the substrate and the stop layer, and treating the stop layer to change its etch selectivity relative to the first semiconductor layer, thereby forming a treated stop layer.

In another embodiment, a method of forming a FinFET device includes forming a first fin in a first region of a substrate and a second fin in a second region of the substrate, forming isolation structures on opposing sides of each of the first and the second fins, and depositing a first polysilicon layer over the substrate, the first and second fins, and the isolation structures. The first polysilicon layer has a topography. The method further includes depositing a stop layer on the first polysilicon layer, and doping the stop layer to modify the etching property of the stop layer.

In yet another embodiment, a method of forming a semiconductor device includes forming a first polysilicon layer, a stop layer and a second polysilicon layer sequentially over a substrate. The stop layer, the first polysilicon layer, and the second polysilicon layer have a topography. The stop layer is treated to have an etch selectivity substantially the same as the first and the second polysilicon layers. The method also includes removing a top portion of the second polysilicon layer via a planarization process, etching a remaining portion of the second polysilicon layer, the stop layer, and a top portion of the first polysilicon layer, and patterning a remaining portion of the first polysilicon layer to form a first gate structure and a second gate structure. The first and the second gate structures have substantially equal gate heights.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor integrated circuit (IC), the method comprising:
   forming a first semiconductor layer over a substrate, the first semiconductor layer having an uneven upper surface;
   forming a stop layer over the first semiconductor layer, the first semiconductor layer disposed between the substrate and the stop layer; and
   treating the stop layer to change its etch selectivity relative to the first semiconductor layer, thereby forming a treated stop layer.

2. The method of claim 1, wherein the first semiconductor layer is a polysilicon layer.

3. The method of claim 1, wherein the stop layer comprises silicon nitride, silicon carbide, silicon oxynitride, combinations thereof, or multilayers thereof.

4. The method of claim 1, wherein the treating the stop layer comprises:
doping the stop layer with a dopant selected from the group consisting essentially of carbon, carbon dioxide, sulfur, sulfur dioxide, and combinations thereof.

5. The method of claim 4, wherein the doping the stop layer is performed with a dosage between about $5^{14}/cm^2$ to about $6^{15}/cm^2$.

6. The method of claim 1, wherein the etch selectivity between the treated stop layer and the first semiconductor layer is in a range from about 0.8 to about 1.2.

7. The method of claim 1 further comprising:
forming a second semiconductor layer over the treated stop layer, wherein the first and the second semiconductor layers comprise a same material, the treated stop layer being disposed between the first and the second semiconductor layers.

8. The method of claim 7 further comprising:
removing the second semiconductor layer, the treated stop layer, and a top portion of the first semiconductor layer, wherein a remaining portion of the first semiconductor layer has a planar upper surface.

9. The method of claim 8, wherein removing the second semiconductor layer, the treated stop layer, and the top portion of the first semiconductor layer comprises:
removing a top portion of the second semiconductor layer via a planarization process, a remaining portion of the second semiconductor layer covering the treated stop layer after the planarization process; and
removing the remaining portion of the second semiconductor layer, the treated stop layer, and a top portion of the first semiconductor layer.

10. The method of claim 9, wherein the planarization process is a chemical mechanical planarization (CMP) process.

11. The method of claim 9, wherein the removing the remaining portion is performed by a plasma etch process.

12. The method of claim 9 further comprising:
patterning the remaining portion of the first semiconductor layer to form a first gate structure in a first region of the IC and a second gate structure in a second region of the IC, wherein the first and the second regions of the IC have different pattern densities, wherein the first and the second gate structures have substantially equal gate heights.

13. The method of claim 12 further comprising replacing at least one of the first and the second gate structures with a replacement gate in a gate-last process.

14. A method of forming a fin field-effect transistor (FinFET) device, the method comprising:
forming a first fin in a first region of a substrate and a second fin in a second region of the substrate;
forming isolation structures on opposing sides of each of the first and the second fins;
depositing a first polysilicon layer over the substrate, the first and second fins, and the isolation structures, the first polysilicon layer having a topography;
depositing a stop layer on the first polysilicon layer; and
doping the stop layer to modify the etching property of the stop layer, thereby forming a doped stop layer.

15. The method of claim 14 further comprising depositing a second polysilicon layer on the doped stop layer, the doped stop layer being disposed between the first and the second polysilicon layers.

16. The method of claim 15 further comprising:
performing a planarization process followed by an etching process to remove the second polysilicon layer, the doped stop layer, and a top portion of the first polysilicon layer, a remaining portion of the first polysilicon layer having a planar upper surface.

17. The method of claim 14, wherein the stop layer comprises a material selected from the group consisting essentially of silicon nitride, silicon carbide, silicon oxynitride, and combinations thereof.

18. The method of claim 14, wherein the doping the stop layer uses a dopant selected from the group consisting essentially of carbon, carbon dioxide, sulfur, and sulfur dioxide, and combinations thereof.

19. The method of claim 18, wherein the etch selectivity between the doped stop layer and the first and the second polysilicon layers is in a range from about 0.8 to about 1.2.

20. A method of forming a semiconductor device, the method comprising:
forming a first polysilicon layer, a stop layer and a second polysilicon layer sequentially over a substrate, wherein the stop layer, the first polysilicon layer, and the second polysilicon layer have a topography, wherein the stop layer is treated to have an etch selectivity substantially the same as the first and the second polysilicon layers;
removing a top portion of the second polysilicon layer via a planarization process;
etching a remaining portion of the second polysilicon layer, the stop layer, and a top portion of the first polysilicon layer; and
patterning a remaining portion of the first polysilicon layer to form a first gate structure and a second gate structure, wherein the first and the second gate structures have substantially equal gate heights.

* * * * *